(12) United States Patent
Chin et al.

(10) Patent No.: US 8,787,414 B1
(45) Date of Patent: Jul. 22, 2014

(54) METHODS AND SYSTEMS FOR PROVIDING A LOW STRESS ELECTRODE CONNECTION

(75) Inventors: Aland K. Chin, Sharon, MA (US); Richard H. Chin, Somerville, MA (US)

(73) Assignee: Science Research Laboratory, Inc., Somerville, MA (US)

(*) Notice: Subject to any disclaimer, the term of this patent is extended or adjusted under 35 U.S.C. 154(b) by 108 days.

(21) Appl. No.: 13/606,733

(22) Filed: Sep. 7, 2012

Related U.S. Application Data

(60) Provisional application No. 61/531,788, filed on Sep. 7, 2011.

(51) Int. Cl.
*H01S 3/04* (2006.01)

(52) U.S. Cl.
USPC .................. 372/36; 372/34; 372/35; 372/107

(58) Field of Classification Search
CPC ..... H01S 5/02415; H01S 5/4025; H01S 3/04; H01S 5/02423; H01S 5/02476; H01S 3/042; H01S 5/024; H01S 3/0405; H01S 5/02236; H01S 3/0407; H01S 5/02438; H01S 5/02407
USPC .......... 372/34–36, 107; 438/25–29, 121, 122, 438/116, 455, 456; 257/720, 713, 714, 718, 257/721, 722, E23.087–E23.088, E23.09, 257/E21.501, E33.055–E33.058
See application file for complete search history.

(56) References Cited

U.S. PATENT DOCUMENTS

| | | | |
|---|---|---|---|
| 4,181,900 A * | 1/1980 | Tajnai et al. ................... 372/72 |
| 4,315,225 A * | 2/1982 | Allen et al. ..................... 372/35 |
| 5,727,618 A * | 3/1998 | Mundinger et al. ......... 165/80.4 |
| 5,828,683 A | 10/1998 | Freitas |
| 6,027,256 A * | 2/2000 | Nightingale et al. ........... 385/92 |
| 6,097,744 A * | 8/2000 | Takigawa et al. ............... 372/34 |
| 6,310,900 B1 | 10/2001 | Stephens et al. |
| 6,934,309 B2 * | 8/2005 | Nishikawa et al. ............ 372/36 |
| 7,502,398 B2 * | 3/2009 | Schleuning et al. ........... 372/36 |
| 7,686,224 B2 * | 3/2010 | Schleuning et al. ..... 235/462.35 |
| 7,957,439 B2 | 6/2011 | Stephens et al. |
| 8,340,144 B1 * | 12/2012 | Grove ............................. 372/34 |
| 2006/0215715 A1* | 9/2006 | Kouta et al. .................... 372/36 |
| 2008/0192785 A1* | 8/2008 | Schulz-Harder et al. ....... 372/36 |
| 2008/0225913 A1* | 9/2008 | Stohr et al. ..................... 372/36 |
| 2012/0093183 A1* | 4/2012 | Liu ................................. 372/35 |
| 2012/0177073 A1 | 7/2012 | Stephens, IV et al. |
| 2013/0051414 A1* | 2/2013 | Grove ............................. 372/36 |

OTHER PUBLICATIONS

Lorenzen, D. et al., Packaging and microcooling of high power diode laser bars. Industrial Electronics Society, IECON '98 Proceedings of the 24th Annual Conference of the IEEE, 1998, pp. 2342-2347, vol. 4.

(Continued)

*Primary Examiner* — Jessica Stultz
*Assistant Examiner* — Delma R Forde
(74) *Attorney, Agent, or Firm* — Burns & Levinson LLP; Orlando Lopez

(57) ABSTRACT

Systems and methods for providing a low stress electrode connection capable of carrying a high electrical current to an edge-emitting device, such as a laser diode are described. Systems and methods for providing mechanisms to allow precise adjustment of the relative position of one heat-sink for an optical edge emitting device relative to an adjacent heat-sink in a stack of heat-sinks are also provided herein.

24 Claims, 11 Drawing Sheets

(56) References Cited

OTHER PUBLICATIONS

Dix, J. et al., Enhanced microchannel cooling for high-power semiconductor diode lasers. High-Power Diode Laser Technology and Applications VI, Feb. 13, 2008, pp. 687606-1-687606-10, vol. 6876.

Fiebig, C. et al., Stable and compact mounting scheme for > 1 kW QCW diode laser stacks at 940nm. Proc. SPIE 6876, High-Power Diode Laser Technology and Applications, Feb. 13, 2008, pp. 68760J-1-68760J-10, vol. 6876, 68760J.

* cited by examiner

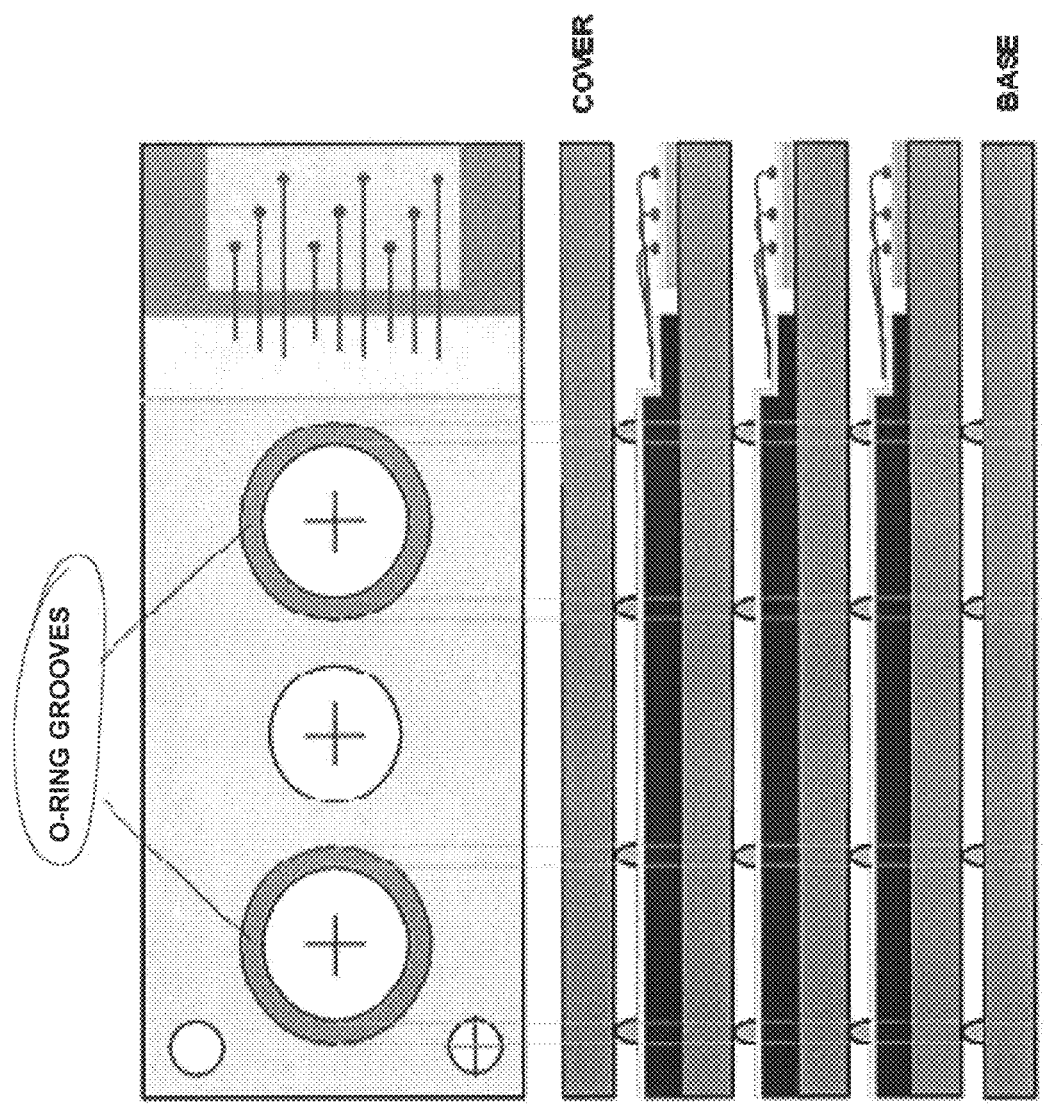

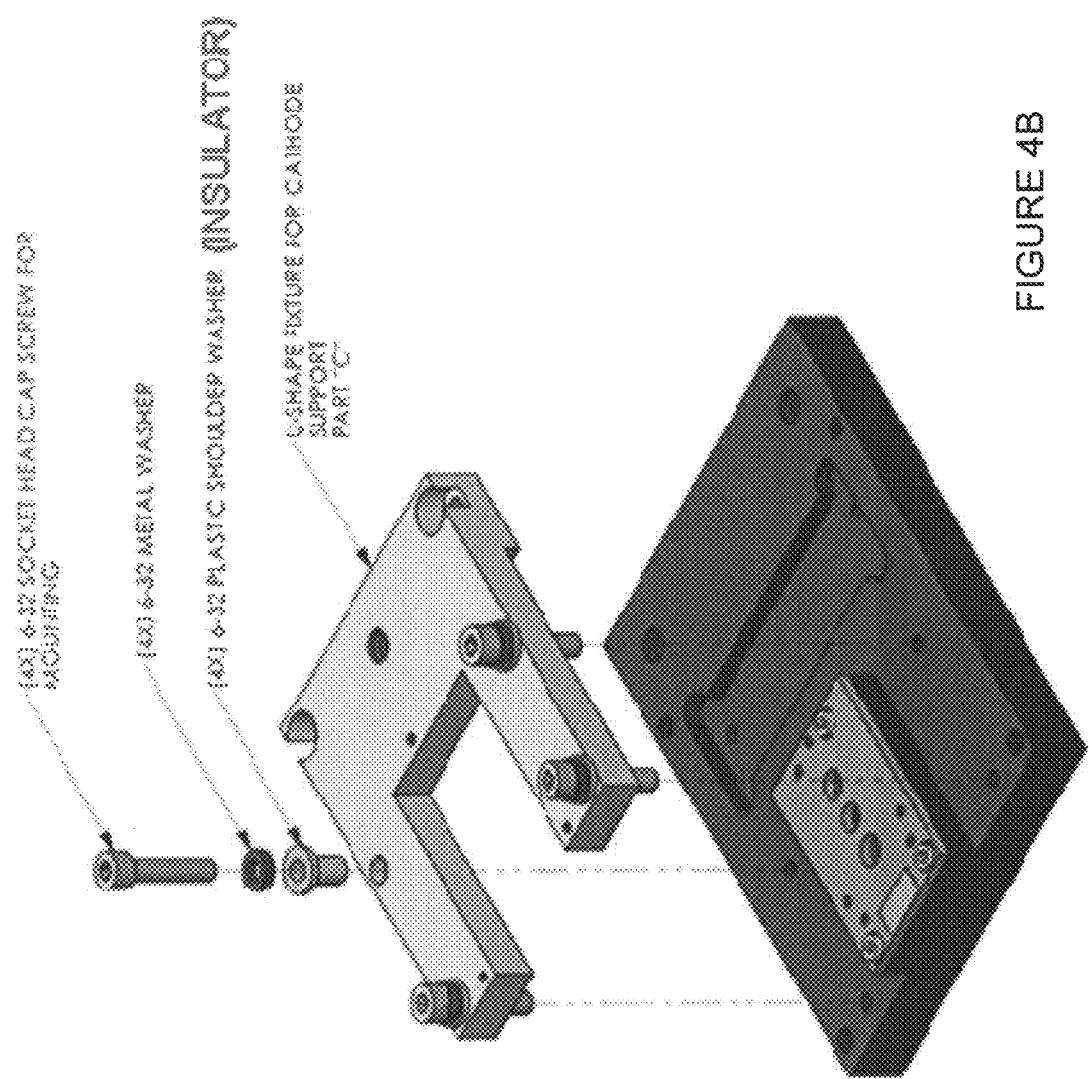

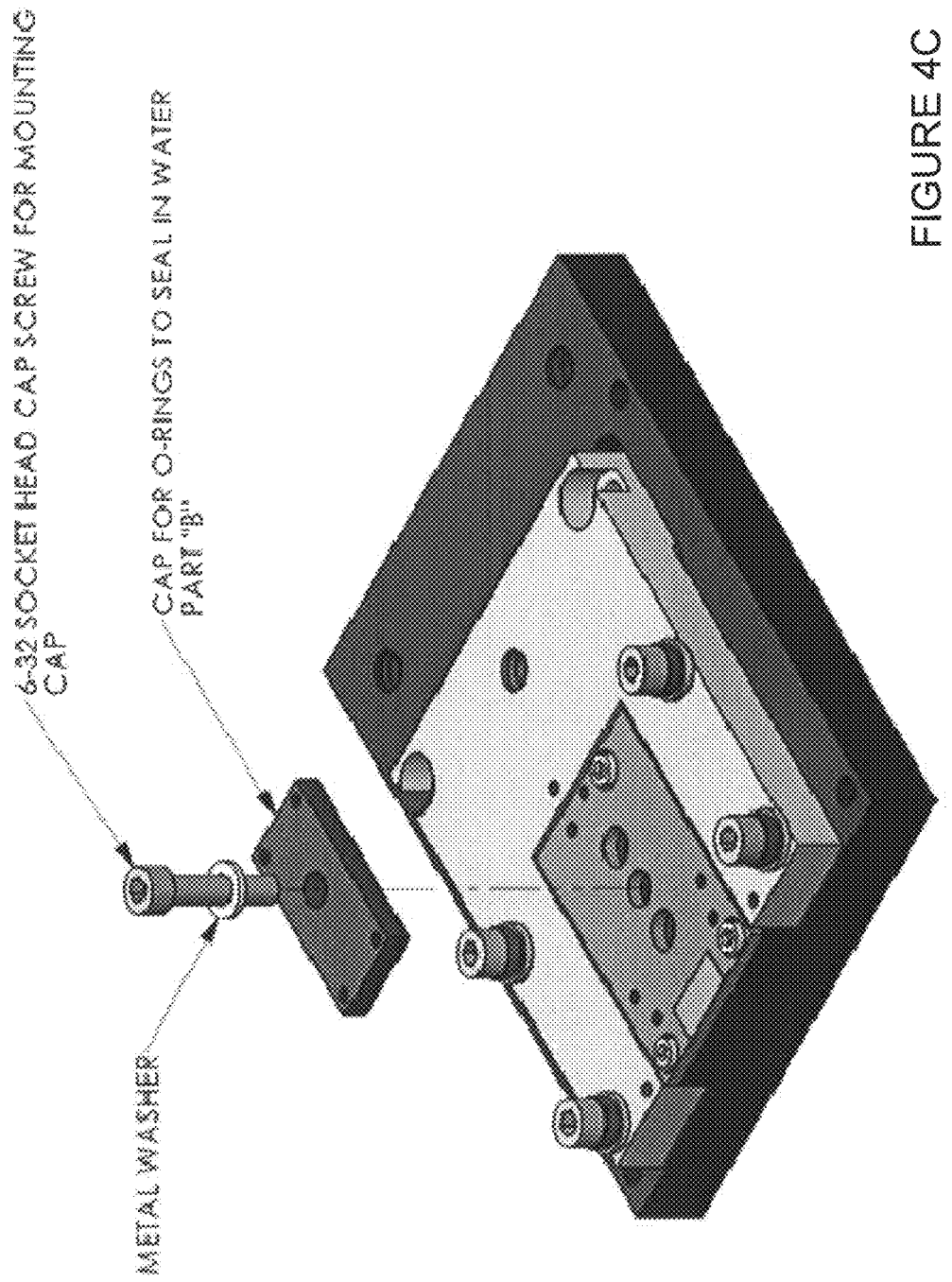

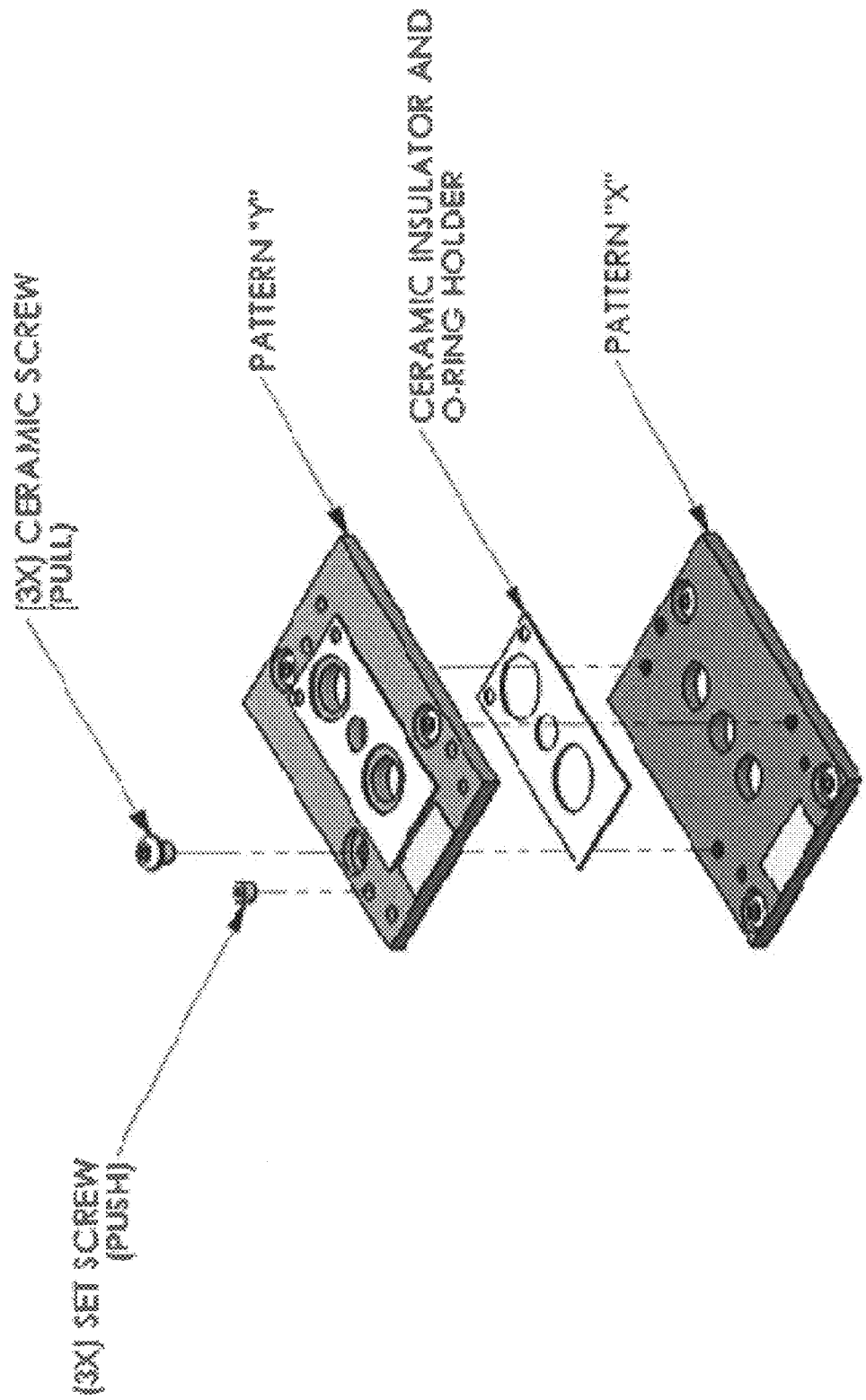

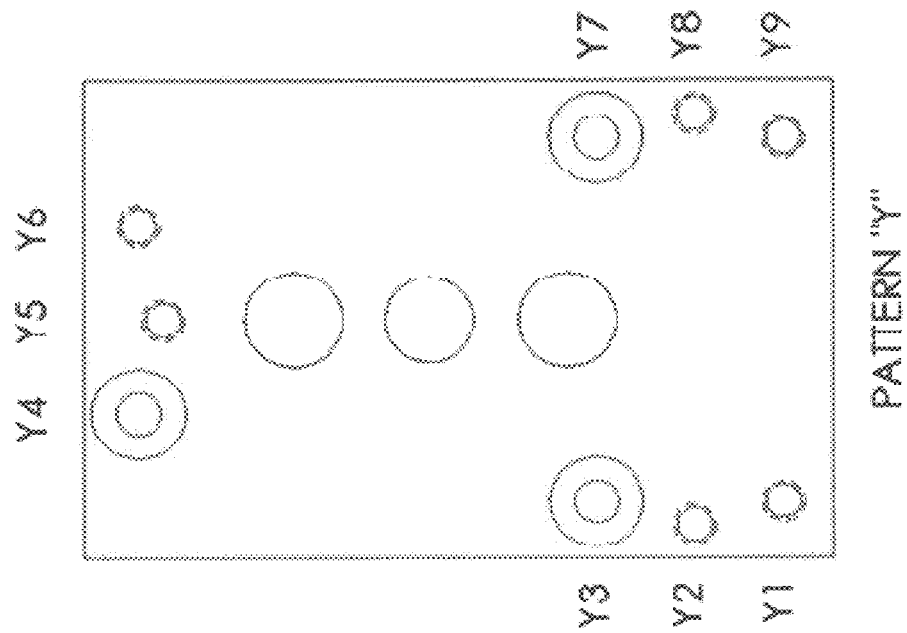
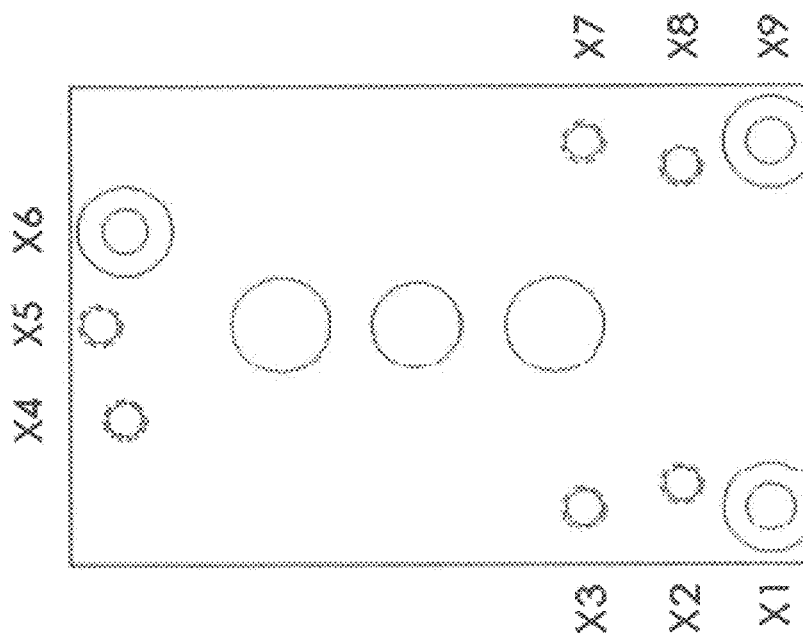
FIGURE 6

METHODS AND SYSTEMS FOR PROVIDING A LOW STRESS ELECTRODE CONNECTION

CROSS REFERENCE TO RELATED APPLICATIONS

This application claims priority to U.S. Provisional Application No. 61/531,788, filed on Sep. 7, 2011, entitled METHODS AND SYSTEMS FOR PROVIDING A LOW STRESS ELECTRODE CONNECTION CAPABLE OF CARRYING A HIGH ELECTRICAL CURRENT, which is incorporated by reference herein in its entirety and for all purposes.

BACKGROUND OF THE INVENTION

The present teachings relate to systems and methods for forming a low stress electrical connection between laser diode systems and to forming a low stress connection that is capable of carrying a high electrical current.

A laser diode bar (LD-bar) is a monolithic semiconductor device, typically approximately 10 mm wide by approximately 150 μm thick, which contains numerous individual laser diodes (LDs) that are electrically in parallel. The top and bottom surfaces are the cathode and anode, respectively. The anode of the LD-bar is usually attached to a heat-sink since the light emitting regions, which generate heat, are generally much closer to the anode. The LD-bars are used individually as a linear source of high optical-power or in a stack as a two-dimensional source of high optical-power. Optical sources based on LD-bars are useful to optically pump other solid-state lasers, such as Nd:YAG laser, Yb-doped fiber laser, or as a direct energy source. Optical sources based on LD-bars can be useful when the optical power is coupled to an optical fiber. The efficiency of coupling optical power from a stack of LD-bars into an optical fiber depends on the placement accuracy of the LD-bars relative to each other.

For laser diode bars operating at high power in the continuous wave (CW) mode, the laser diode is generally attached to a water-cooled micro-channel heat-sink (MCH). The MCH has a water inlet and a water outlet and corresponding water seals to prevent the water from leaking. In one embodiment, O-rings are implemented as the water seals. LD-bars, each attached to a MCH, can be stacked so that the LD-bars are electrically coupled in series to form a two-dimensional array of light emitters. For stacking, the anode surface and the cathode surface of the MCH should be relatively flat and parallel.

The present high-power LD-bars generally have a slope efficiency of approximately 1 W/A. Additionally, the LD-bars are limited to operation at approximately 50-200 W due to thermal or reliability limitations to the device performance. For LD-bars emitting output power of approximately 50 W to 100 W, wire bonds are generally used to connect the LD-bar cathode to the MCH cathode. Such wire bonds are generally made of gold and the cathode surfaces are also generally made of gold. Attachment of the gold wire bond to the gold cathode surface is formed by thermo-compression. To avoid mechanical damage to the LD-bar from the thermo-compression attachment process, the gold wires are generally small in size, for instance, approximately 25-50 μm in diameter for round wires and approximately 25 μm×250 μm for ribbon bonds. For short lengths of wire, such as for lengths of several millimeters, each wire can carry 1-5 A of current, reliably. Thus, a 100 W LD-bar requires 20-100 wire bonds evenly distributed over the LD-bar cathode. For higher power and consequently, higher current, a thin metal foil, soldered to the LD-bar cathode, connects the LD-bar cathode to the MCH cathode. The solder should have a melting temperature that is lower than that of the solder used to attach the LD-bar to the MCH and should be sufficiently malleable at room temperature to avoid applying significant mechanical stress, due to coefficient of expansion mismatch between the metal foil and the LD-bar, which can be detrimental to LD-bar performance and reliability.

Accordingly, there is a need to provide techniques for forming a low stress electrical connection between the metal foil and the cathode of a high power LD-bar that is capable of carrying a high electrical current.

SUMMARY OF THE INVENTION

The present disclosure is directed towards technologies for providing a low stress electrode connection capable of carrying a high electrical current to an edge-emitting device, such as a laser diode. Furthermore, technologies for providing mechanisms to allow precise adjustment of the relative position of one heat-sink for an optical edge emitting device relative to an adjacent heat-sink in a stack of heat-sinks are also provided herein.

According to one or more embodiments, the system of these teachings includes a cooling component, a laser diode disposed on the cooling component, an anode of the laser diode being electrically coupled and attached to the cooling component, a base component, the cooling component being disposed on and attached to the base component, the base component being electrically connected to the cooling component, a mechanical support component disposed on the base component and surrounding the cooling component and the laser diode, the mechanical support component being electrically isolated from the cooling component and the base component, and a connection plate component disposed over a cathode of the laser diode and over the mechanical support component and configured to be mechanically attached to the mechanical support component by means of a push attachment component and a pull attachment component, wherein the push attachment component and the pull attachment component are configured to provide substantially controlled positioning of the connection plate to the mechanical support, the connection plate component being electrically connected to the mechanical support component and the cathode of the laser diode.

According to one or more embodiments, the laser diode stack of these teachings includes a number of laser diode systems, each laser diode system having a cooling component, the cooling component having a number of groups of attachment locations, each group of attachment locations configured to receive one push attachment component and one pull attachment component and having three attachment locations, the three attachment locations being disposed substantially sequentially, equidistant in one instance, and a laser diode disposed on the cooling component; an anode of the laser diode being electrically coupled and attached to the cooling component. The cooling component is in one of two configurations. In a first configuration, a first attachment location in each group of attachment locations is configured to receive a pull attachment component. In a second configuration, a last of the attachment locations is configured to receive a pull attachment component. The laser diode stack also includes one or more insulating components, the one or more insulating components being disposed over the cooling component on a surface on which the laser diode is disposed on. The one or more insulating components are configured to hold a water inlet seal and a water outlet seal and are disposed away from the laser diode and the number of groups of attachment locations. The one or more insulating components are located between each two consecutive laser diode systems in the laser diode stack; and are configured such that a cathode of the laser diode in one laser diode system is in electrical connection with the cooling component of another laser diode system. The cooling component of one laser diode system is of one of the two configurations and the cooling component of another laser diode system is in another configuration from the two configurations.

In one or more instances, the method of these teachings for forming a low stress electrical connection for carrying a high electrical current in a laser diode system includes placing a laser diode on a cooling component, an anode of the laser diode being electrically coupled and attached to the cooling component, attaching the cooling component to a base component, the base component being electrically connected to the cooling component, disposing a mechanical support component on the base component, the mechanical support component surrounding the cooling component and the laser diode and being electrically isolated from the cooling component and the base component, and placing a connection plate component over a cathode of the laser diode and over the mechanical support component, the connection plate component being configured to be mechanically attached to the mechanical support component by means of a push attachment component and a pull attachment component, the push attachment component and the pull attachment component being configured to provide substantially controlled position of the connection plate to the mechanical support, the connection plate component being electrically connected to the mechanical support component and the cathode of the laser diode.

In one or more embodiments, the method of these teachings for forming a low stress electrical connection in a laser diode stack includes incorporating at least one mechanical adjustment mechanism in each laser diode system of the number of laser diode systems in the laser diode stack, the at least one mechanical adjustment mechanism comprising one push attachment component and one pull attachment component, each laser diode system having a cooling component and a laser diode disposed in the cooling component, an anode of the laser diode being electrically coupled and attached to the cooling component, and disposing an insulating component between each two consecutive laser diode systems in the laser diode stack, the insulating component being configured such that a cathode of the laser diode in one laser diode system is in electrical connection with the cooling component of another laser diode system when the insulating component is disposed between the one laser diode system and the other laser diode system.

Embodiments of the method and system of these teachings are also disclosed herein below.

For a better understanding of the present teachings, together with other and further needs thereof, reference is made to the accompanying drawings and detailed description and its scope will be pointed out in the appended claims.

BRIEF DESCRIPTION OF THE DRAWINGS

The present disclosure is illustratively shown and described in reference to the accompanying drawing in which:

FIG. 2 shows top and side views of a cover and a base separated from a laser diode attached to a water-cooled micro-channel heat-sink according to;

FIG. 3 shows top and side views of stacked LD-bars arranged such that the LD-bars are electrically coupled in series to form a two-dimensional array of light emitters;

FIG. 4A-D shows perspective views of a micro-channel heat-sink forming an electrical connection with a cathode of a high power LD-bar according to various embodiments of the present disclosure;

FIG. 5A-C shows perspective views of stacking high power LD-bars arranged such that the LD-bars are electrically coupled in series according to various embodiments of the present disclosure; and FIG. 6 illustrates a top view of two hole patterns of micro-channel heat-sinks used for stacking high power LD-bars according to various embodiments of the present disclosure.

DETAILED DESCRIPTION

The present disclosure will be more completely understood through the following description, which should be read in conjunction with the attached drawings. In this description, like numbers refer to similar elements within various embodiments of the present disclosure. Within this description, the claims will be explained with respect to embodiments. The skilled artisan will readily appreciate that the methods and systems described herein are merely exemplary and that variations can be made without departing from the spirit and scope of the disclosure.

The following detailed description is of the best currently contemplated modes of carrying out these teachings. The description is not to be taken in a limiting sense, but is made merely for the purpose of illustrating the general principles of these teachings, since the scope of these teachings is best defined by the appended claims.

The present teachings will be more completely understood through the following description, which should be read in conjunction with the drawings. In this description, like numbers refer to similar elements within various embodiments of the present disclosure. Within this description, the claims will be explained with respect to embodiments. The skilled artisan will readily appreciate that the methods, apparatus and systems described herein are merely exemplary and that variations can be made without departing from the spirit and scope of the disclosure. As used herein, the singular forms "a," "an" and "the" include the plural reference unless the context clearly dictates otherwise.

Except where otherwise indicated, all numbers expressing quantities of ingredients, reaction conditions, and so forth used in the specification and claims are to be understood as being modified in all instances by the term "about."

Before describing the present teachings in detail, certain terms are defined herein for the sake of clarity.

A "push attachment component," as used herein, is an attachment component that is pushed or moved into a surface in order to adjust.

A "pull attachment component," as used herein, is an attachment component that is pulled or moved away from the surface in order to adjust.

The term "laser diode," as used herein, refers to an edge-emitting device having a cathode and an anode.

Figure 1:
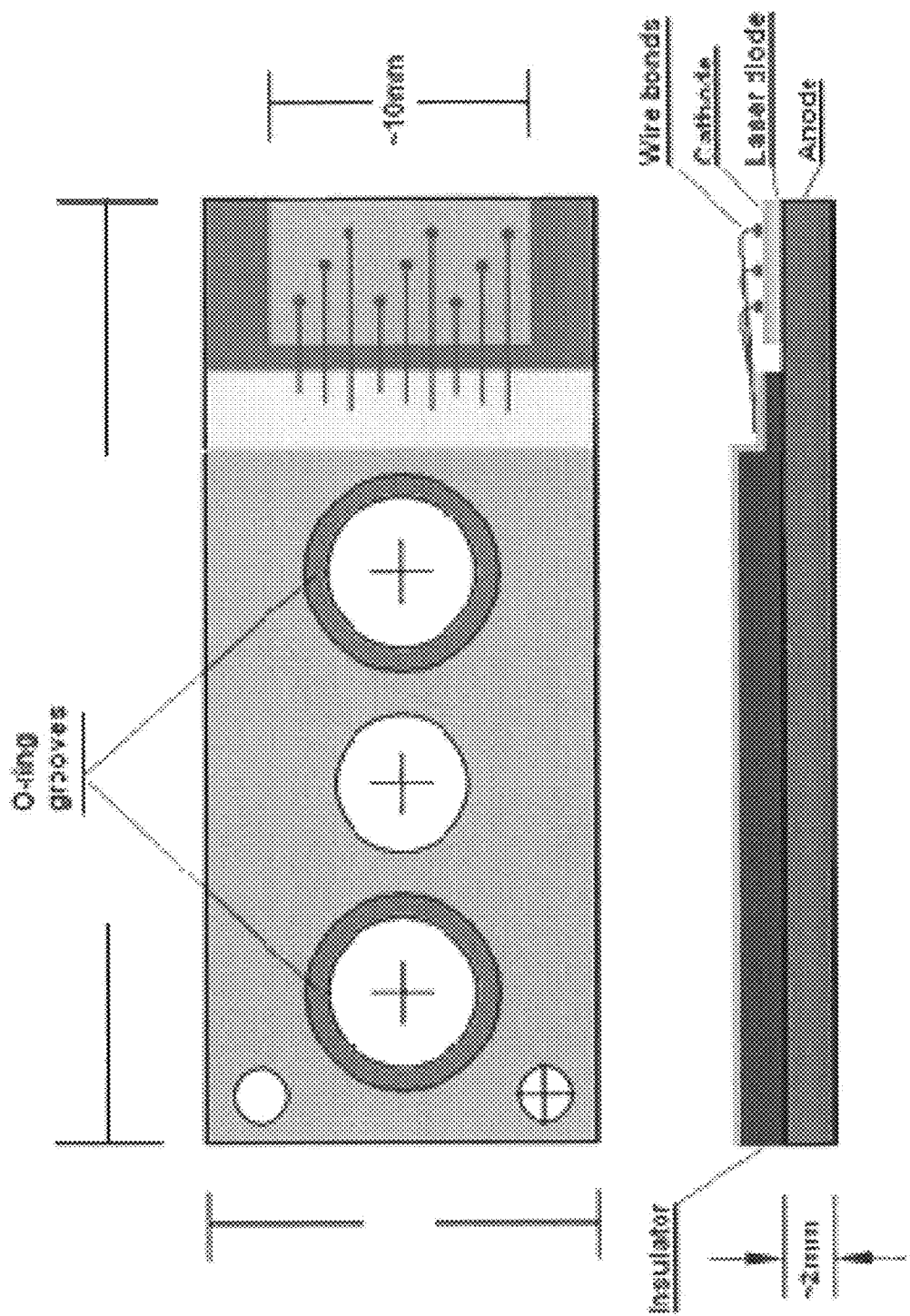
FIG. 1 shows top and side views of a laser diode attached to a water-cooled micro-channel heat-sink.

For laser diode bars operating at high power in the continuous wave (CW) mode, the laser diode is generally attached to a water-cooled micro-channel heat-sink (MCH) as shown in FIG. 1. For high current LDs, the body of the MCH is the anode since the laser diode is attached directly to the heat-sink to reduce the thermal impedance and to reduce the electrical resistance. The cathode is electrically isolated from the body of the MCH using an electrical insulator. The anode connection of the LD is formed by attaching or soldering the diode to the MCH. The electrical connection between the MCH cathode and the LD cathode is generally formed using a foil bond or multiple wire bonds, as shown in FIG. 1. The maximum height of the wire bonds or the foil bond should be less than the height of the MCH cathode to allow stacking as will be discussed below.

Figure 2:
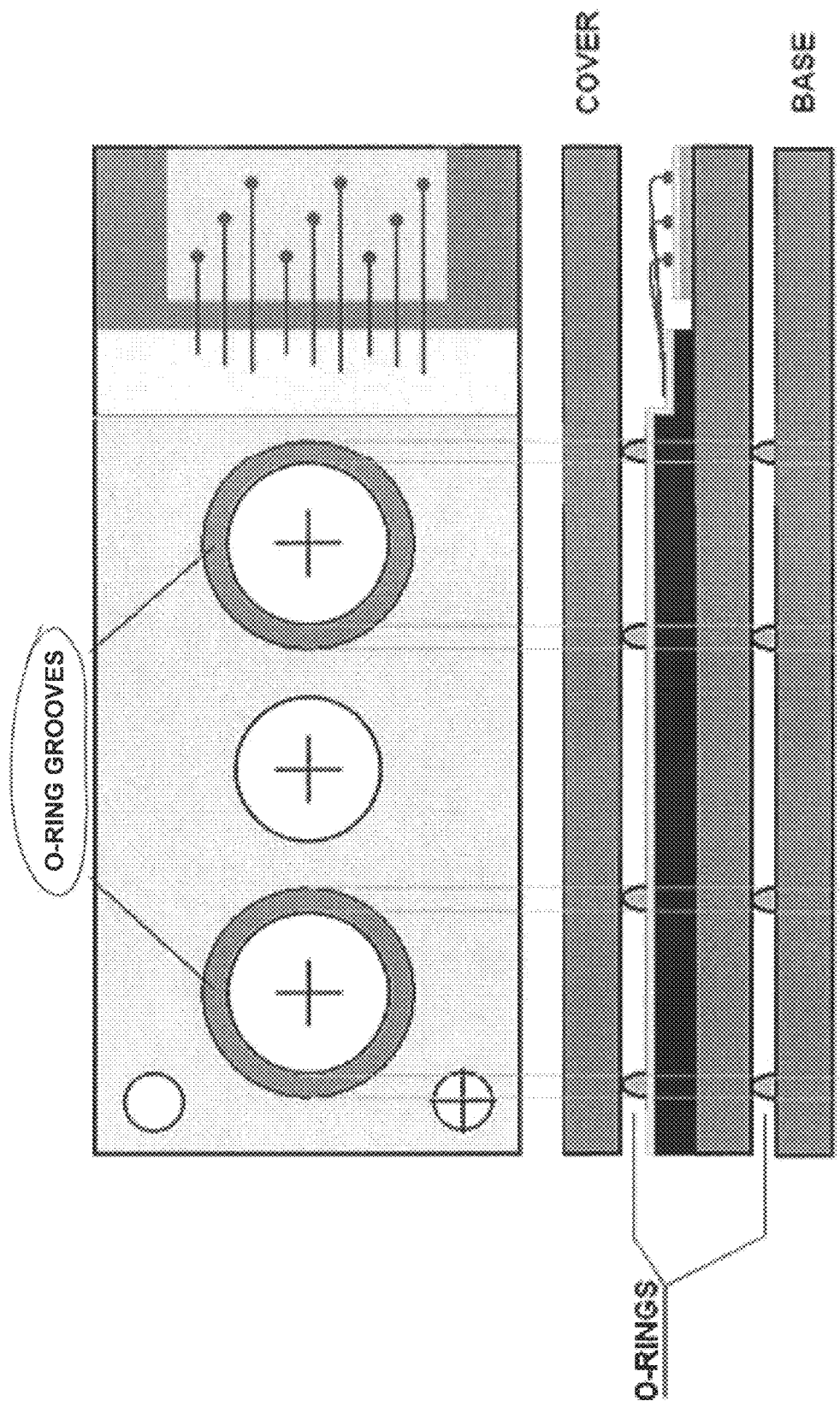

The MCH has a water inlet and a water outlet and corresponding water seals to prevent the water from leaking to the cover or the base. In one embodiment, o-rings are implemented as the water seals as shown in FIG. 2. A screw connecting the cover and the base compresses the cover, MCH and base so that electrical connections are made between the cover and the cathode of the MCH and the anode of the MCH and the base. The diameter of the screw is smaller than the through hole in the MCH to avoid electrical connection with the MCH body. The cover becomes the LD-bar cathode and the base becomes the LD-bar anode.

As shown in FIG. 3, LD-bars, each attached to a MCH, can be stacked so that the LD-bars are electrically coupled in series to form a two-dimensional array of light emitters. For stacking, the anode surface and the cathode surface of the MCH should be relatively flat and parallel. Additionally, the cathode surface of the MCH should be higher than the cathode surface of the LD-bar and the height of the wire bonds or foil bond. A screw connecting cover and base compresses the entire stack so that electrical connections are made between each of the MCHs. The diameter of the compression screw is smaller than the through holes in each of the MCHs to avoid electrical connection with the bodies of the MCHs. The cover becomes the cathode for the LD-bar stack and the base becomes the anode for the LD-bar stack.

According to one or more embodiments, the system of these teachings includes a cooling component, a laser diode disposed on the cooling component, an anode of the laser diode being electrically coupled and attached to the cooling component, a base component, the cooling component being disposed on and attached to the base component, the base component being electrically connected to the cooling component, a mechanical support component disposed on the base component and surrounding the cooling component and the laser diode, the mechanical support component being electrically isolated from the cooling component and the base component, and a connection plate component disposed over a cathode of the laser diode and over the mechanical support component and configured to be mechanically attached to the mechanical support component by means of a push attachment component and a pull attachment component, wherein the push attachment component and the pull attachment component are configured to provide substantially controlled positioning of the connection plate to the mechanical support, the connection plate component being electrically connected to the mechanical support component and the cathode of the laser diode.

In one instance, the system of these teachings also includes a cover component disposed over the cooling component on a surface on which the laser diode is disposed on. The cover component is configured to seal a water inlet and a water outlet on the surface. In that instance, the mechanical support component has an opening configured to receive the cover component; the mechanical support component being electrically isolated from the cover component.

In another instance, an insulator electrically isolates the mechanical support component from the cooling component and the base component.

In yet another instance, the connection plate component has a number of groups of attachment locations, each group of attachment locations configured to receive one push attachment component and one pull attachment component. In one embodiment, the number of groups of attachment locations is three (3).

In one or more embodiments, the push attachment component is a push screw and the one pull attachment component is a pull screw. The pull screw and push screw are electrically isolated from at least one of the attachment components so as not to electrically short the laser diode in between the adjacent attachment components.

In still another instance, a layer of optoelectronic solder material is disposed on the laser diode, the layer of optoelectronic solder material being disposed between the laser diode and the mechanical support component. In one embodiment, the optoelectronic solder material is indium.

Figure 4A:
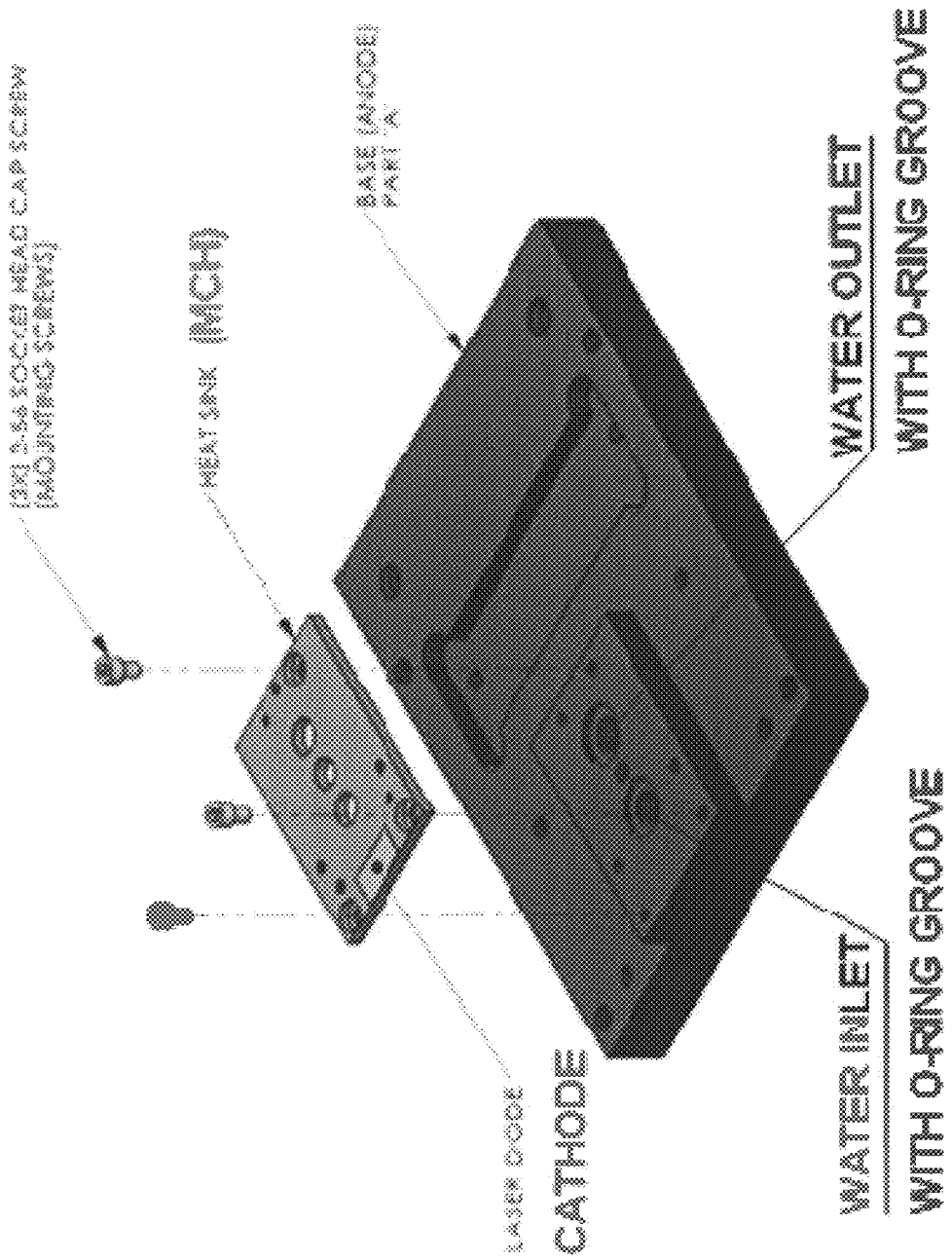

Referring now to FIGS. 4A-D, a method to form an electrical connection to the cathode of a high power LD-bar is shown. FIG. 4A shows the LD-bar anode being attached to the MCH. The top surface of the LD-bar is the LD-bar cathode. The bottom surface of the LD-bar is the LD-bar anode. Attachment of LD-bar anode to the MCH is usually accomplished by soldering. The LD-bar/MCH can be mechanically attached to a base anode, shown as part "A", using attachment means, including but not limited to screws. The base anode enables water inlet and outlet connections and is electrically connected to the MCH body and LD-bar anode. In this example, the water seal between the MCH and the base anode is accomplished using O-rings (not shown) placed into O-ring grooves defined in the base anode.

Referring now also to FIG. 4B, a U-shaped mechanical support, shown as part "C", is mechanically attached to part "A" to serve as a portion of the LD-bar cathode. Part "C" can serve as a mechanical support and can be electrically insulated from part "A" using an insulator, such as polyimide tape (not shown) placed between parts "A" and "C" as well as plastic shoulder washers.

Referring now also to FIG. 4C, the electrical connection between part "C" and the LD-bar cathode can be accomplished. MCHs are constructed with a water inlet and an outlet on both sides of the MCH for simplicity of manufacture and to allow stacking as described below. To function properly, the water inlet and water outlet on one surface must be sealed. Part "B" may be a cover containing O-rings to seal the water inlet and outlet on the surface of the MGH also containing the LD-bar, forcing the water flow through the MCH.

Figure 4D:
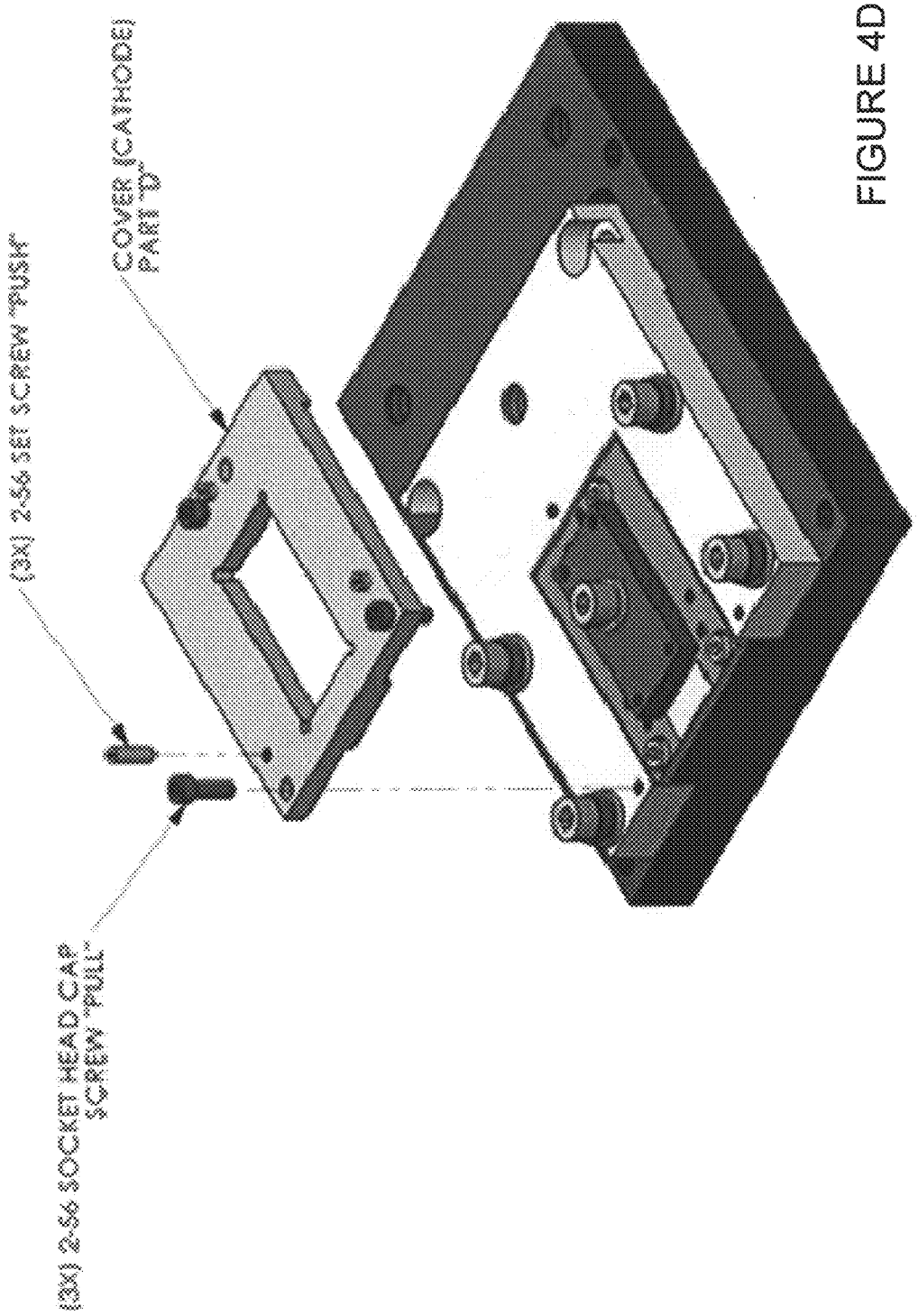

As shown in FIG. 4D, Part "D", which is part of the cathode, is a plate with three sets of screws arranged in a triangular pattern to define a plane. There is an opening in part "D" to accommodate part "B" such that there is no mechanical or electrical contact between the two parts. For each set of screws in part "D", there is a "pull" screw and a "push" screw located adjacent to each other. In part "D", there is a clearance hole for the pull screw and a threaded hole for the push screw. In part "C", there is a mating set of three threaded holes located at the positions of the three pull screws in part "D". Tightening the pull screws bring part "C" and part "D" closer together. Tightening the push screws forces part "C" and part "D" further apart. Manipulating, by either tightening or loosening, the three sets of push and pull screws allows precise controlled positioning of part "D" relative to part "C" and thus the LD-bar cathode. To avoid mechanical damage to the LD-bar and provide a high-current electrical connection between the LD-bar and part "D", a foil of indium or other suitable material is inserted between the LD-bar and part "D" prior to attaching part "D" to part "C". The malleable indium foil accommodates any residual non-uniform spacing between the LD-bar and part "D" and is a low resistance electrical contact capable of carrying high electrical current. This indium foil along with part "D" replaces the wire bonds or foil bonds used in existing commercially available LD-bars.

In one or more instances, the method of these teachings for forming a low stress electrical connection for carrying a high electrical current in a laser diode system includes placing a laser diode on a cooling component, an anode of the laser diode being electrically coupled and attached to the cooling component, attaching the cooling component to a base component, the base component being electrically connected to the cooling component, disposing a mechanical support component on the base component, the mechanical support component surrounding the cooling component and the laser diode and being electrically isolated from the cooling component and the base component, and placing a connection plate component over a cathode of the laser diode and over the mechanical support component, the connection plate component being configured to be mechanically attached to the mechanical support component by means of a push attachment component and a pull attachment component, the push attachment component and the pull attachment component being configured to provide substantially controlled position of the connection plate to the mechanical support, the connection plate component being electrically connected to the mechanical support component and the cathode of the laser diode.

In one embodiment, the method of these teachings for forming a low stress electrical connection for carrying a high electrical current in a laser diode system also includes disposing a cover component over a surface of the cooling component on which the laser diode is disposed on. The cover component is configured to seal a water inlet and a water outlet on the surface. In that embodiment, the mechanical support component has an opening configured to receive the cover component, the mechanical support component being electrically isolated from the cover component.

According to one or more embodiments, the laser diode stack of these teachings includes a number of laser diode systems, each laser diode system having a cooling component, the cooling component having a number of groups of attachment locations, each group of attachment locations configured to receive one push attachment component and one pull attachment component and having three attachment locations, the three attachment locations being disposed substantially sequentially, and a laser diode disposed on the cooling component; an anode of the laser diode being electrically coupled and attached to the cooling component. The cooling component is in one of two configurations. In a first configuration, a first attachment location in each group of attachment locations is configured to receive a pull attachment component. In a second configuration, a last of the attachment locations is configured to receive a pull attachment component. The laser diode stack also includes one or more insulating components, the one or more insulating components being disposed over the cooling component on a surface on which the laser diode is disposed on. The one or more insulating components are configured to hold a water inlet seal and a water outlet seal and are disposed away from the laser diode and the number of groups of attachment locations. The one or more insulating components are located between each two consecutive laser diode systems in the laser diode stack; and are configured such that a cathode of the laser diode in one laser diode system is in direct electrical connection with the cooling component of another laser diode system. The cooling component of one laser diode system is of one of the two configurations and the cooling component of another laser diode system is in another configuration from the two configurations.

In one instance, the pull attachment component is electrically insulating. In one embodiment, the one pull attachment component is a pull screw and the one pull attachment component includes an electrically insulating shoulder washer. In another embodiment, the one pull attachment component is a pull screw and the one pull attachment component is an insulating screw. In one instance, the insulating screw is a ceramic screw.

Figure 5B:
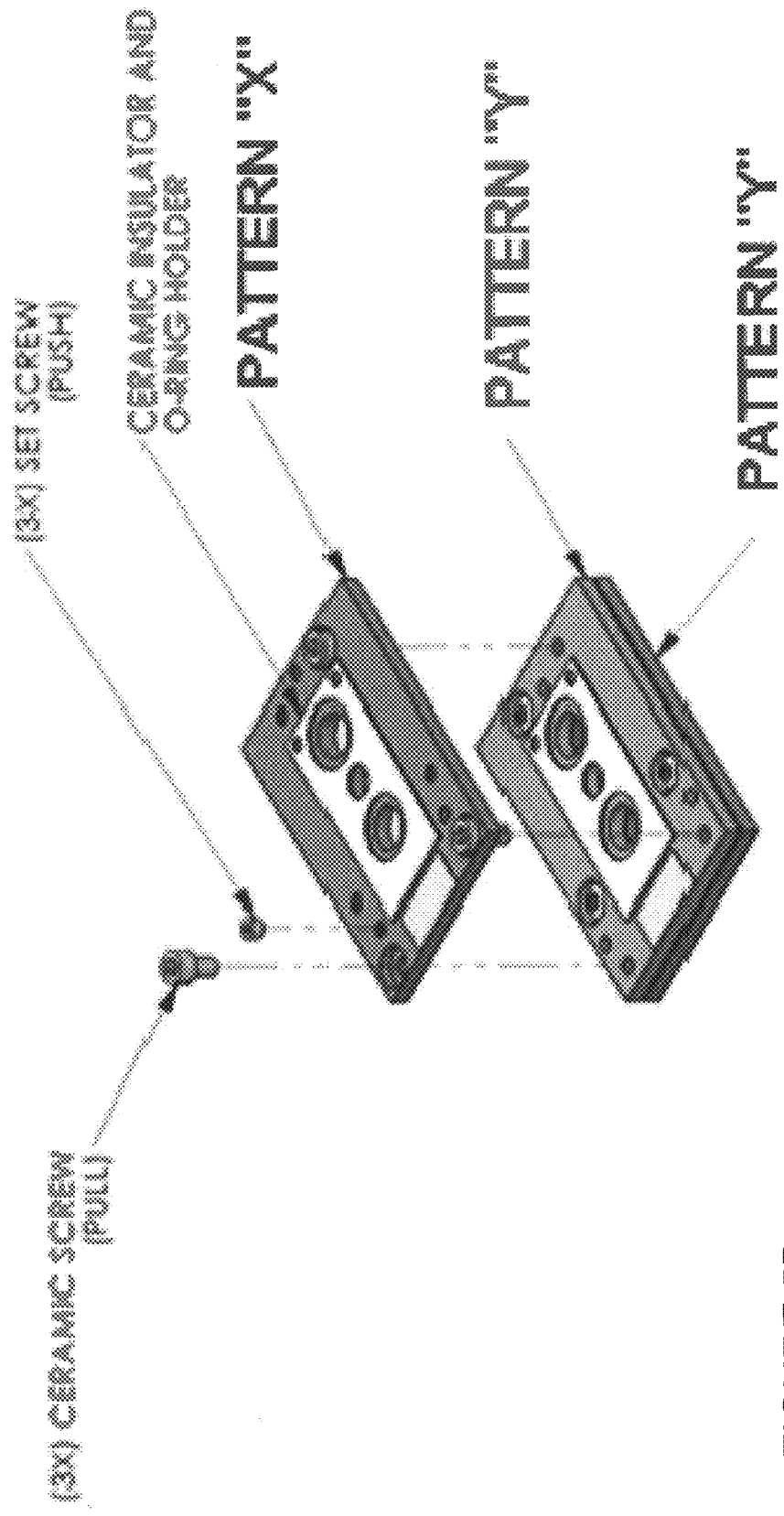
Figure 5C:
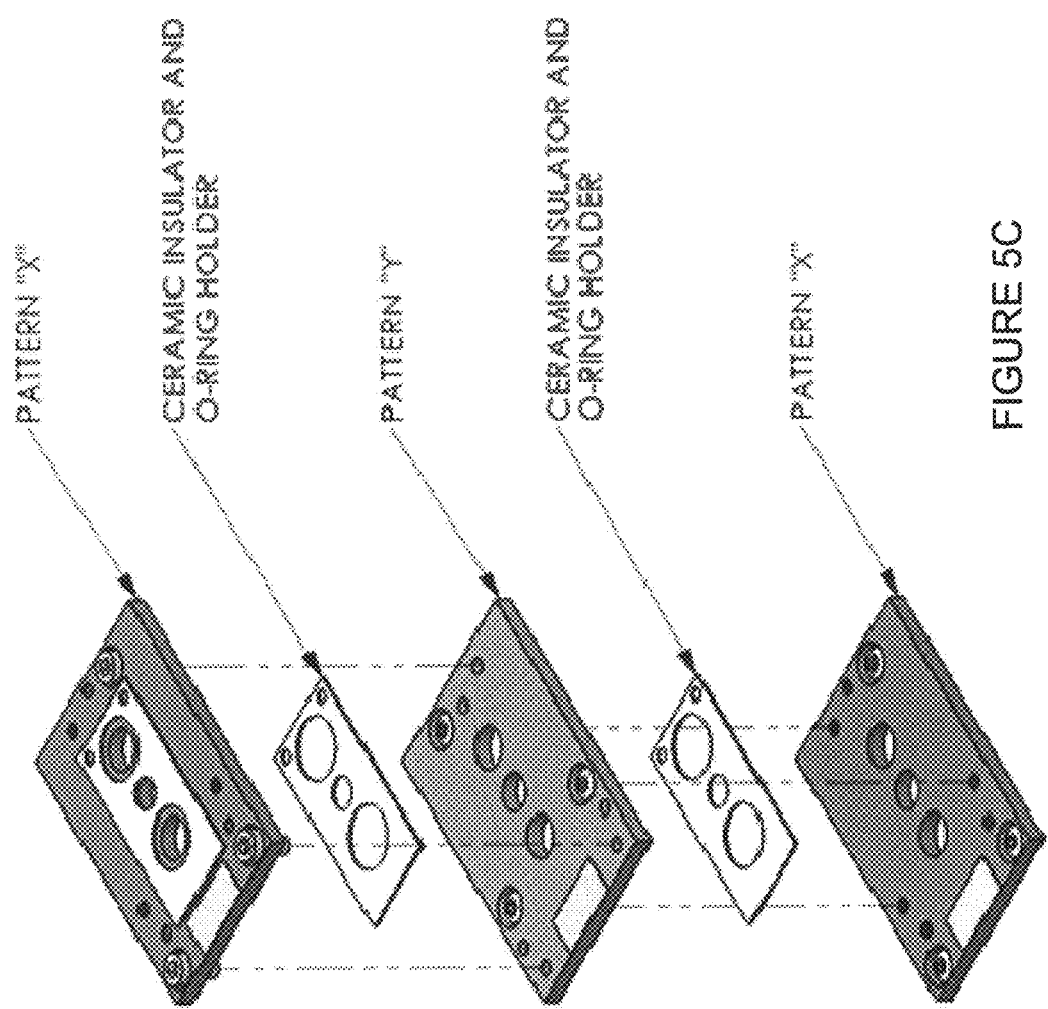

LD-bars, each attached to a MCH, can be stacked by incorporating mechanical adjustment mechanisms, such as push-pull screws, into the MCH as shown in FIGS. 5A-C. In this configuration, the LD-bars are electrically in series. Apart from the MCHs positioned at each end of the stack, each MCH directly acts as the anode for one LD-bar as well as the cathode for the adjacent LD-bar, a configuration that is not used with MCHs.

The pull screws need to be electrically insulating to avoid electrically shorting the LD-bar. Electrically insulating shoulder washers can be used if the spacing between the MCHs, in the stack, is large. For small spacing between the MCHs, insulating screws, including but not limited to, ceramic screws, can be used.

In addition, there needs to be two types of MCHs, each with a slightly different hole-pattern for the push-pull screws to avoid mechanical interference between the adjustment screws on adjacent MCHs. Referring now to FIG. 6, examples of the two patterns are shown as pattern "X" and pattern "Y". Screw holes X2, X3, X4, X5, X7, X8, Y1, Y2, Y5, Y6, Y8, and Y9 are threaded holes with identical threads. Holes X1, X6, X9, Y3, Y4, and Y7 are identical through holes. The center locations of the holes X1, X3, X4, X6, X7 and X9 are identical to the holes Y1, Y3, Y4, Y6, Y7 and Y9.

If MCH with pattern "X" is below MCH with pattern "Y", then the two MCHs can be attached as follows. Pull screws with threads matching screw holes in the MCHs are inserted into through holes Y3, Y4, and Y7 of MCH with pattern "Y" and screwed into threaded holes X3, X4, and X7 of MCH with pattern "X". Screwing in the pull screws pull the two MCHs together. Push screws, generally set screws, with threads matching screw holes in the MCHs are inserted into through holes Y2, Y5, and Y8 of MCH with pattern "Y". Screwing in the push screws push the two MCHs apart. Manipulation of the pull screws and push screws allow precise relative alignment of the two MCHs and once aligned, allows the alignment to be locked by tightening the push screws.

If MCH with pattern "X" is above MCH with pattern "Y", then the two can be attached as follows. Pull screws with threads matching screw holes in the MCHs are inserted into through holes X1, X6, and X9 of MCH with pattern "X" and screwed into threaded holes Y1, Y6, and Y9 of MCH with pattern "Y". Screwing in the pull screws pull the two MCHs together. Push screws, generally set screws, with threads matching screw holes in the MCHs are inserted into through holes X2, X5, and Y8 of MCH with pattern "X". Screwing in the push screws push the two MCHs apart. Manipulation of the pull screws and push screws allow precise relative alignment of the two MCHs and once aligned, allows the alignment to be locked by tightening the push screws.

It should be noted that the above disclosed embodiment for a laser diode stack can be practiced together with prior disclosed embodiment of a laser diode system. In the combined embodiment, the cooling component of a first laser diode system is disposed on and attached to a base component, the base component being electrically connected to the cooling component of the first laser diode system. In the combined embodiment, the laser diode stack also includes a mechanical support component disposed on the base and surrounding the laser diode stack, the mechanical support component being electrically isolated from the laser diode stack and the base component, and a connection plate component disposed over a cathode of the laser diode in a last laser diode system and over the mechanical support component and configured to be mechanically attached to the mechanical support component by means of another push attachment component and another pull attachment component; wherein the other push attachment component and the another pull attachment component are configured to provide substantially controlled position of the connection plate to the mechanical support, the connection plate component being electrically connected to the mechanical support component and the cathode of the laser diode in the last laser diode system. In one instance, the diode stack also includes a cover component disposed over the cooling component of the last laser diode system on a surface on which the laser diode is disposed on. The cover component is configured to seal a water inlet and a water outlet on the surface. In that instance, the mechanical support component has an opening configured to receive the cover component; the mechanical support component being electrically isolated from the cover component. In another instance, the mechanical support component comprises a number of layers, a first layer being disposed on the base component and a last layer being configured to be electrically connected to the mechanical support component and the cathode of the laser diode in the last laser diode system.

In one or more embodiments, the method of these teachings for forming a low stress electrical connection in a laser diode stack includes incorporating at least one mechanical adjustment mechanism in each laser diode system of the number of laser diode systems in the laser diode stack, the at least one mechanical adjustment mechanism comprising one push attachment component and one pull attachment component, each laser diode system having a cooling component and a laser diode disposed in the cooling component, an anode of the laser diode being electrically coupled and attached to the cooling component, and disposing an insulating component between each two consecutive laser diode systems in the laser diode stack, the insulating component being configured such that a cathode of the laser diode in one laser diode system is in electrical connection with the cooling component of another laser diode system when the insulating component is disposed between the one laser diode system and the other laser diode system.

For the purposes of describing and defining the present teachings, it is noted that the term "substantially" is utilized herein to represent the inherent degree of uncertainty that may be attributed to any quantitative comparison, value, measurement, or other representation. The term "substantially" is also utilized herein to represent the degree by which a quantitative representation may vary from a stated reference without resulting in a change in the basic function of the subject matter at issue.

The present disclosure is illustratively described above in reference to the disclosed embodiments. Various modifications and changes may be made to the disclosed embodiments by persons skilled in the art without departing from the scope of the present disclosure as defined in the appended claims.

What is claimed is:

1. A system comprising:
    a cooling component;
    a laser diode disposed on the cooling component; an anode of the laser diode being electrically coupled and attached to the cooling component;
    a base component; the cooling component being disposed on and attached to the base component; the base component being electrically connected to the cooling component;
    a mechanical support component disposed on the base component and surrounding the cooling component and the laser diode; the mechanical support component being electrically isolated from the cooling component and the base component; and
    a connection plate component disposed over a cathode of the laser diode and over the mechanical support component and configured to be mechanically attached to the mechanical support component by means of a push attachment component and a pull attachment component; wherein the push attachment component and the pull attachment component are configured to provide substantially controlled position of the connection plate component to the mechanical support component; the connection plate component being electrically connected to the mechanical support component and the cathode of the laser diode.

2. The system of claim 1 further comprising a cover component disposed over the cooling component on a surface on which the laser diode is disposed on; the cover component configured to seal a water inlet and a water outlet on the surface; the mechanical support component comprising an opening configured to receive the cover component; the mechanical support component being electrically isolated from the cover component.

3. The system of claim 1 wherein the push attachment component is a push screw; and wherein the pull attachment component is a pull screw.

4. The system of claim 1 wherein an insulator electrically isolates the mechanical support component from the cooling component and the base component.

5. The system of claim 1 wherein the connection plate component comprises a number of groups of attachment locations; each group of attachment locations configured to receive one push attachment component and one pull attachment component.

6. The system of claim 5 wherein the one push attachment component is a push screw; and wherein the one pull attachment component is a pull screw.

7. The system of claim 5 wherein the number of groups of attachment locations is three (3).

8. The system of claim 1 wherein a layer of optoelectronic solder material is disposed on the laser diode; the layer of optoelectronic solder material being disposed between the laser diode and the mechanical support component.

9. The system of claim 8 wherein the optoelectronic solder material is Indium.

10. A laser diode stack comprising:
    a number of laser diode systems, each laser diode system comprising:
        a cooling component; the cooling component having a number of groups of attachment locations; each group of attachment locations configured to receive one push attachment component and one pull attachment component and having three attachment locations; the three attachment locations being disposed substantially sequentially; the cooling component being in one of two configurations; in a first configuration, a first attachment location in each group of attachment locations being configured to receive a pull attachment component; in a second configuration, a last attachment location in each group of attachment locations being configured to receive a pull attachment component; and a laser diode disposed on the cooling component; an anode of the laser diode being electrically coupled and attached to the cooling component; and at least one insulating component; said at least one insulating component being disposed over the cooling component on a surface on which the laser diode is disposed on; the at least one insulating component configured to hold a water inlet seal and a water outlet seal; said at least one insulating component being disposed away from the laser diode and the number of groups of attachment locations; wherein said at least one insulating component is located between each two consecutive laser diode systems in the laser diode stack; wherein said at least one insulating component is configured such that a cathode of the laser diode in one laser diode system is in direct electrical connection with the cooling component of another laser diode system; and wherein the cooling component of the one laser diode system is of one of the two configurations and the cooling component of said another laser diode system is of another configuration from the two configurations.

11. The laser diode stack of claim 10 wherein the one push attachment component is a push screw; and wherein the one pull attachment component is a pull screw.

12. The laser diode stack of claim 10 wherein the cooling component of a first laser diode system is disposed on and attached to a base component; the base component being electrically connected to the cooling component; and the laser diode stack further comprises;

a mechanical support component disposed on the base component and surrounding the laser diode stack; the mechanical support component being electrically isolated from the laser diode stack and the base component; and a connection plate component disposed over a cathode of the laser diode in a last laser diode system and over the mechanical support component and configured to be mechanically attached to the mechanical support component by means of another push attachment component and another pull attachment component; wherein the another push attachment component and the another pull attachment component are configured to provide substantially controlled position of the connection plate component to the mechanical support component; the connection plate component being electrically connected to the mechanical support component and the cathode of the laser diode in the last laser diode system.

13. The laser diode stack of claim 12 wherein the mechanical support component comprises a number of layers; a first layer being disposed on the base component and a last layer being configured to be electrically connected to the mechanical support component and the cathode of the laser diode in the last laser diode system.

14. The laser diode stack of claim 10 wherein the one pull attachment component is electrically insulating.

15. The laser diode stack of claim 14 wherein the one pull attachment component is a pull screw; and wherein the one pull attachment component comprises an electrically insulating shoulder washer.

16. The laser diode stack of claim 14 wherein the one pull attachment component is a pull screw; and wherein the one pull attachment component is an insulating screw.

17. The laser diode stack of claim 16 wherein the insulating screw is a ceramic screw.

18. A method for forming a low stress electrical connection for carrying a high electrical current in a laser diode system, the method comprising:

placing a laser diode on a cooling component; an anode of the laser diode being electrically coupled and attached to the cooling component;

attaching the cooling component to a base component; the base component being electrically connected to the cooling component;

disposing a mechanical support component on the base component; the mechanical support component surrounding the cooling component and the laser diode and being electrically isolated from the cooling component and the base component; and placing a connection plate component over a cathode of the laser diode and over the mechanical support component; the connection plate component being configured to be mechanically attached to the mechanical support component by means of a push attachment component and a pull attachment component; wherein the push attachment component and the pull attachment component are configured to provide substantially controlled position of the connection plate component to the mechanical support component; the connection plate component being electrically connected to the mechanical support component and the cathode of the laser diode.

19. The method of claim 18 further comprising:

disposing a cover component over a surface of the cooling component on which the laser diode is disposed on; the cover component configured to seal a water inlet and a water outlet on the surface; the mechanical support component comprising an opening configured to receive the cover component; the mechanical support component being electrically isolated from the cover component.

20. A method for forming a low stress electrical connection in a laser diode stack, the method comprising:

incorporating at least one mechanical adjustment mechanism in each laser diode system of a number of laser diode systems in the laser diode stack; the at least one mechanical adjustment mechanism comprising one push attachment component and one pull attachment component; said each laser diode system comprising a cooling component and a laser diode disposed in the cooling component; an anode of the laser diode being electrically coupled and attached to the cooling component; and disposing an insulating component between each two consecutive laser diode systems in the laser diode stack; the insulating component being configured such that a cathode of the laser diode in one laser diode system is in direct electrical connection with the cooling component of another laser diode system when the insulating component is disposed between the one laser diode system and the another laser diode system.

21. The method of claim 20 wherein each cooling component comprises a number of groups of attachment locations; each group of attachment locations configured to receive one mechanical adjustment mechanism and having three attachment locations; and wherein the cooling component being in one of two configurations; in a first configuration, a first attachment location in each group of attachment locations being configured to receive the one pull attachment component; in a second configuration, a last attachment location in each group of attachment locations being configured to receive the one pull attachment component.

22. The method of claim 20 wherein the one pull attachment component is electrically insulating.

23. The method of claim 22 wherein the one pull attachment component is a pull screw; and wherein the one pull attachment component comprises an electrically insulating shoulder washer.

24. The method of claim 22 wherein the one pull attachment component is a pull screw; and wherein the one pull attachment component is an insulating screw.

* * * * *

UNITED STATES PATENT AND TRADEMARK OFFICE
CERTIFICATE OF CORRECTION

PATENT NO.         : 8,787,414 B1
APPLICATION NO.    : 13/606733
DATED              : July 22, 2014
INVENTOR(S)        : Aland K. Chin et al.

It is certified that error appears in the above-identified patent and that said Letters Patent is hereby corrected as shown below:

In the Claims

In column 11, line 37 (claim 12), "further comprises;" should read -- further comprises: --

Signed and Sealed this
Twenty-first Day of October, 2014

Michelle K. Lee
*Deputy Director of the United States Patent and Trademark Office*